United States Patent
Park et al.

(10) Patent No.: US 8,279,400 B2
(45) Date of Patent: Oct. 2, 2012

(54) SUPER-RESOLUTION LITHOGRAPHY APPARATUS AND METHOD BASED ON MULTI LIGHT EXPOSURE METHOD

(75) Inventors: Hee Su Park, Daejeon (KR); Sun Kyung Lee, Daejeon (KR); Jae Yong Lee, Chungbuk (KR); Sang-Kyung Choi, Daejeon (KR); Dong-Hoon Lee, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 846 days.

(21) Appl. No.: 12/403,111

(22) Filed: Mar. 12, 2009

(65) Prior Publication Data

US 2010/0123889 A1    May 20, 2010

(30) Foreign Application Priority Data

Nov. 20, 2008   (KR) .................. 10-2008-0115576

(51) Int. Cl.
   *G03B 27/42* (2006.01)
(52) U.S. Cl. ............................. 355/53; 355/67; 355/77
(58) Field of Classification Search .................. 355/53, 355/67, 77
   See application file for complete search history.

(56) References Cited

U.S. PATENT DOCUMENTS 6,667,830 B1 * 12/2003 Iketaki et al. ............... 359/368
2007/0127007 A1 * 6/2007 Cormont et al. ............. 355/403

OTHER PUBLICATIONS

Hee Su Park and Sun Kyung Lee, "Quantum Lithography Based on Multiple Light Exposures for Arbitrary Sub-Diffraction-Limit Pattern Generation", arXiv:0806.2175, Jun. 13, 2008.
Hee Su Park, Sun Kyung Lee, and Jae Yong Lee, "Generation of Super-Resolution Atomic State Density Distribution Based on Temporally-Cascaded Multiple Light Exposures", Optics Express, Dec. 22, 2008, pp. 21982-21990, vol. 16, No. 26.

* cited by examiner

*Primary Examiner* — Toan Ton
*Assistant Examiner* — Mesfin T Asfaw
(74) *Attorney, Agent, or Firm* — Fenwick & West LLP

(57) ABSTRACT

Disclosed herein is a super-resolution lithography apparatus and method based on a multiple light exposure method. The super-resolution lithography apparatus comprises a photographic medium having energy levels of a first ground state, a second ground state, a first excited state, a second excited state and a quenching state; a first light source inducing energy level transition between the first ground state and the first excited state of the photographic medium; a second light source inducing energy level transition between the second ground state and the first excited state of the photographic medium; and a third light source inducing energy level transition between the second ground state and the second excited state of the photographic medium. Accordingly, the resolution of lithography can be improved simply by using a photographic medium having a simple structure and conventional laser beams and increasing the number of exposure steps. Furthermore, a multiple photon absorber that is difficult to obtain, a medium having a complicated energy level and a high-efficiency quantum optical light are unnecessary, and thus economic efficiency is improved.

13 Claims, 5 Drawing Sheets

SUPER-RESOLUTION LITHOGRAPHY APPARATUS AND METHOD BASED ON MULTI LIGHT EXPOSURE METHOD

CROSS-REFERENCE TO RELATED APPLICATION

This application claims priority under 35 U.S.C. §119(a) from Republic of Korea Patent Application No. 10-2008-0115576 filed on Nov. 20, 2008, which is incorporated by reference herein.

BACKGROUND OF THE INVENTION

1. Field of the Invention

The present invention relates to a super-resolution lithography apparatus and method based on a multi light exposure method, and more particularly, to a multi light exposure method based super-resolution lithography apparatus and method for improving the resolution of lithography by using a photographic medium having five different energy levels and three light sources that induce combining of energy levels.

2. Background of the Related Art

Improvement of resolution is one of core factors for developing lithography technology for forming micro-structures. The limit of resolution of lithography using light is determined by diffraction of the light. Generally, it is difficult to form a structure having a size smaller than the wavelength of light through lithography. Accordingly, there is a trend towards developing light sources and optical elements capable of generating light having a shorter wavelength. However, since most conventional laser media and optical glass operate at wavelengths near visible light, it is required to discover or invent new materials in order to reduce the wavelength of light.

Recently, super-resolution lithography methods capable of overcoming the limit of resolution due to diffraction of light without varying the wavelength of light have been proposed. These methods reduce the effective wavelength of light to much shorter than the actual wavelength of light by using the quantum-mechanical state of light or multiple photon absorption to increase the resolution several times. However, most of the proposed methods require a medium having a complicated energy level that does not actually exist or a quantum optical light having an output power which is so high that it cannot be actually achieved, and thus it is difficult to practically use the methods.

SUMMARY OF THE INVENTION

Accordingly, the present invention has been made in view of the above-mentioned problems occurring in the prior art, and it is a primary object of the present invention to provide a multiple light exposure method based super-resolution lithography apparatus and method for improving the resolution of lithography by using a photographic medium having five different energy levels and three light beams that induce combining of energy levels.

To accomplish the above object of the present invention, according to an aspect of the present invention, there is provided a super-resolution lithography apparatus based on a multiple light exposure method, the super-resolution lithography apparatus including a photographic medium having energy levels of a first ground state, a second ground state, a first excited state, a second excited state and a quenching state; a first light source inducing energy level transition between the first ground state and the first excited state of the photographic medium; a second light source inducing energy level transition between the second ground state and the first excited state of the photographic medium; and a third light source inducing energy level transition between the second ground state and the second excited state of the photographic medium.

According to another aspect of the present invention, there is provided a super-resolution lithography method based on a multiple light exposure method, the super-resolution lithography method including a first step of exposing a photographic medium having a plurality of energy levels to a first light source and a second light source and a second step of exposing the photographic medium having the plurality of energy levels to a third light source.

The super-resolution lithography method may further include a third step of confirming whether a desired energy level distribution is obtained through the first and second steps. The first and second steps may be continuously repeated more than twice until the desired energy level distribution is obtained in the third step.

The present invention can improve the resolution of lithography simply by using a photographic medium having a simple structure and conventional laser beams and increasing the number of exposure steps. Furthermore, the present invention does not require a multiple photon absorber that is difficult to obtain, a medium having a complicated energy level and a high-efficiency quantum optical light, and thus economic efficiency is improved.

BRIEF DESCRIPTION OF THE DRAWINGS

The above and other objects, features and advantages of the present invention will be apparent from the following detailed description of the preferred embodiments of the invention in conjunction with the accompanying drawings.

DETAILED DESCRIPTION OF THE PREFERRED EMBODIMENT

Preferred embodiments of the present invention will be explained with reference to the attached drawings.

<Configuration of Super-Resolution Lithography Apparatus Based on Multiple Light Exposure Method>

Figure 1:
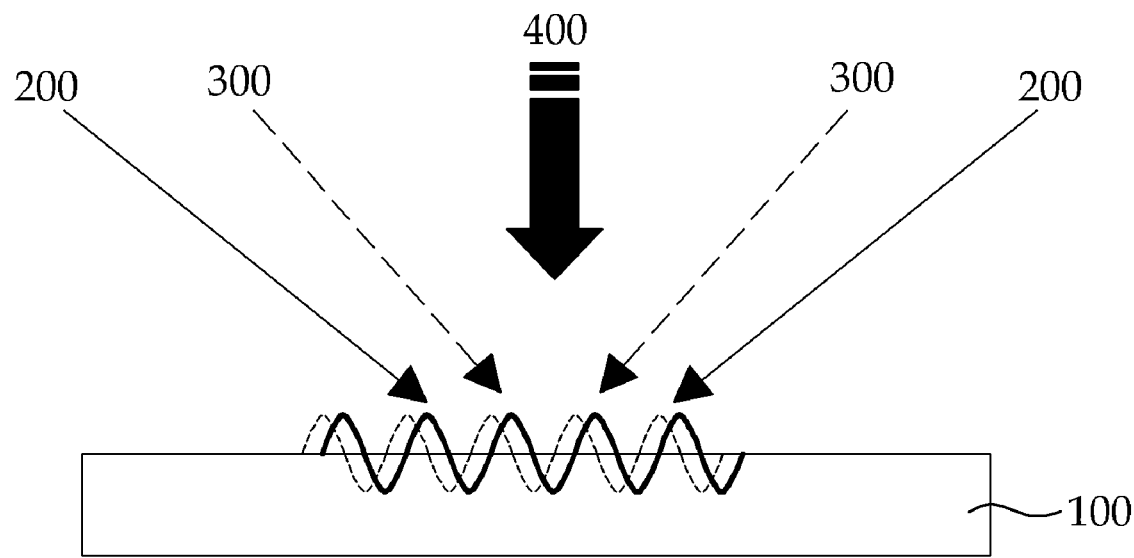
FIG. 1 illustrates a configuration of a super-resolution lithography apparatus based on a multiple light exposure method according to the present invention.

FIG. 1 illustrates a configuration of a super-resolution lithography apparatus based on a multiple light exposure method according to the present invention. Referring to FIG. 1, the super-resolution lithography apparatus based on the multiple light exposure method according to the present invention includes a photographic medium 100 and first, second and third light sources 200, 300 and 400.

Figure 2:
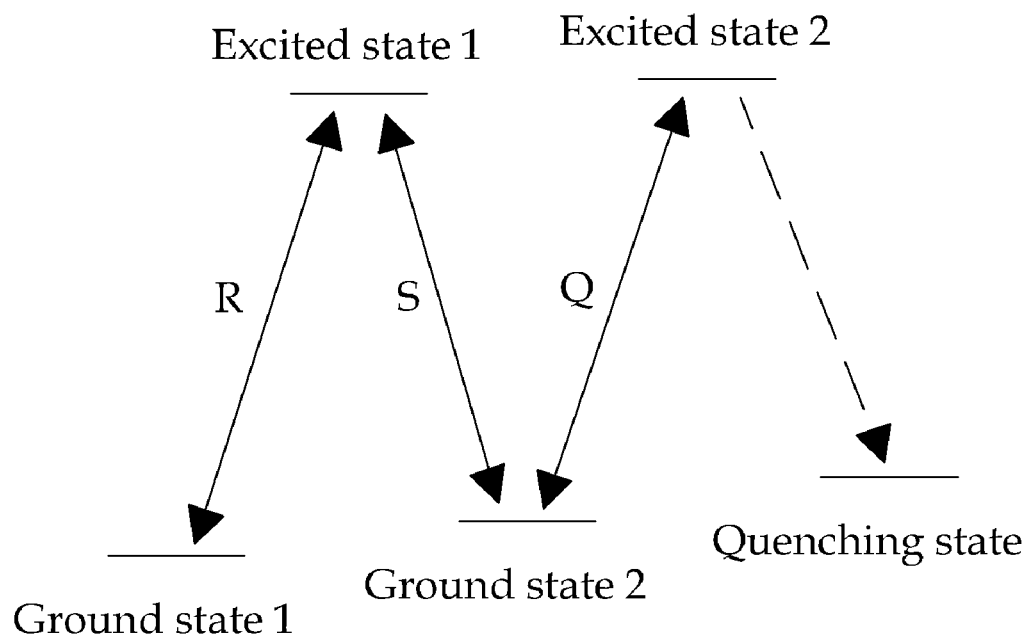
FIG. 2 illustrates energy levels of a photographic medium according to the present invention.

FIG. 2 illustrates energy levels of the photographic medium 100 according to the present invention. The energy levels of the photographic medium 100 include a first ground state, a second ground state, a first excited state, a second excited state and a quenching state. The first excited state spontaneously decays to the first ground state and the second ground state, and the second excited state spontaneously decays to the second ground state and the quenching state according to a selection rule in the energy levels. Any photographic medium can be used if it can satisfy the aforementioned condition of the energy levels. However, it is desirable to use Ar, n-type GaAs or Pr-doped SiO as the photographic medium 100.

The first, second and third light sources 200, 300 and 400 are laser beams having different wavelengths. These laser beams are irradiated by a laser generator to the photographic medium 100.

The first light 200 according to the present invention includes spatial intensity distribution for lithography and is in resonance with an energy difference between the first ground state and the first excited state to induce transition between the first ground state and the first excited state. The second light source 300 according to the present invention includes spatial intensity distribution for lithography and is phase-matched to an energy difference between the second ground state and the first excited state to induce transition between the second ground state and the first excited state. The third light source 400 is spatially uniform and is phase-matched to an energy difference between the second ground state and the second excited state of the photographic medium 100 to induce transition between the second ground state and the second excited state. The intensities of transition according to the first, second and third light sources 200, 300 and 400 can be represented by Rabi frequency. The intensities of transition are denoted by R, S and Q for convenience of explanation.

<Super-resolution Lithography Method Based on Multiple Light Exposure Method>

(First Embodiment)

Figure 3:
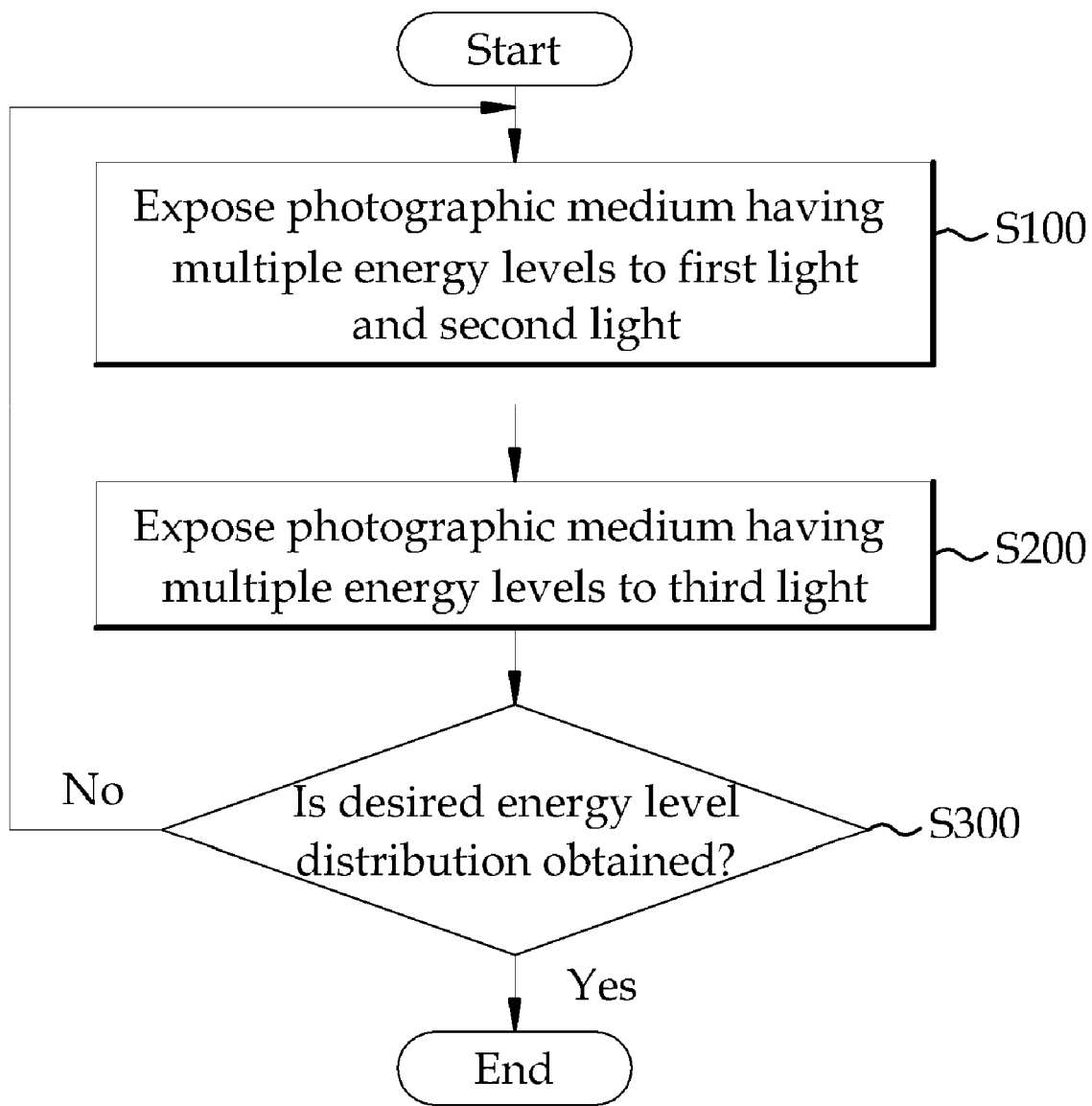
FIG. 3 is a flow chart showing a super-resolution lithography method based on a multiple light exposure method according to the present invention.

FIG. 3 is a flow chart showing a super-resolution lithography method based on a multiple light exposure method according to the present invention.

Referring to FIGS. 2 and 3, the photographic medium 100 is exposed to the first light source 200 and the second light source 300 having the spatial intensity distribution for lithography in step S100. Here, the atomic energy level of the photographic medium 100 has a dark state distribution represented by Equation 1.

$$|D_A\rangle = \frac{(S|g_1\rangle - R|g_2\rangle)}{\sqrt{|S|^2 + |R|^2}} \qquad \text{[Equation 1]}$$

Here, $|g_1\rangle$ and $|g_2\rangle$ are quantum-mechanical wave functions respectively corresponding to the first ground state and the second ground state, and S and R denote the Rabi frequencies of transition according to the first and second light sources 200 and 300.

Subsequently, the photographic medium 100 is exposed to the spatially uniform third light source 400 in step S200.

Then, all the atoms $|g_2\rangle$ in the second ground state in the photographic medium 100 are transited to the quenching state $|q\rangle$.

The final atomic state after the aforementioned two steps S100 and S200 corresponds to a mixed state of the first ground state $|g_1\rangle$ and the extinction state $|q\rangle$. Here, the probability that atoms exist in the first ground state $|g_1\rangle$ can be represented by Equation 2.

$$\frac{|S|^2}{(|S|^2 + |R|^2)} \qquad \text{[Equation 2]}$$

Here, S and R denote the Rabi frequencies of transition according to the first and second light sources 200 and 300 illustrated in FIG. 2.

Finally, it is determined whether a desired light distribution is achieved in step S300. If the desired light distribution cannot be obtained, the steps S100 and S200 are repeated. A process composed of the steps S100 and S200 is referred to as a unit exposure process for convenience of explanation. When the unit exposure process is repeatedly performed and Rabi frequencies according to the first and second light sources 200 and 300 in the ith unit exposure process are respectively denoted by $S_i$ and $R_i$, the probability that atoms exist in the first ground state $|g_1\rangle$ can be represented by Equation 3.

$$P(|g_1\rangle) = \prod_i |S_i|^2 / (|S_i|^2 + |R_i|^2) \qquad \text{[Equation 3]}$$

The spatial distribution of $S_i$ or $R_i$ has a resolution limit that is referred to as Rayleigh limit according to diffraction of light. However, a pattern represented by the product of multiple spatial distributions, as represented by Equation 3, can represent a spatial distribution finer than a diffraction limit.

Figure 4:
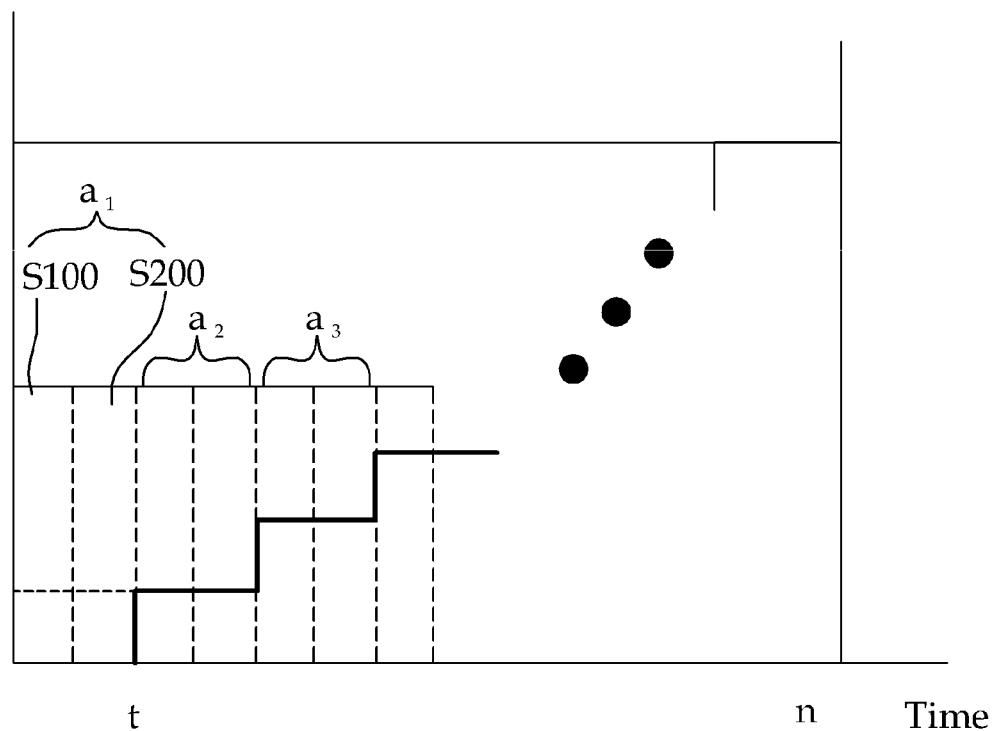
FIG. 4 illustrates a unit exposure process of the multiple light exposure method based super-resolution lithography method according to the present invention.

FIG. 4 illustrates the unit exposure process constructing the multiple light exposure method based super-resolution lithography method according to the present invention. When N unit exposure processes each of which has light distribution corresponding to a standing wave represented by Equation 4 are performed, for instance, the phase of the standing wave is changed for each unit exposure process, as illustrated in FIG. 4.

$$S_i = \Omega \sin\left(\frac{k_o Z + 2\pi(i-1)}{N}\right) e^{i\omega_1 t} \qquad \text{[Equation 4]}$$

$$R_i = \Omega \cos\left(\frac{k_o Z + 2\pi(i-1)}{N}\right) e^{i\omega_2 t}$$

Here, $\Omega$ denotes a constant, $k_0$ denotes the wave number of the standing wave on the surface of the photographic medium 100 illustrated in FIG. 2, $\omega_1$ and $\omega_2$ respectively represent angular velocities of the first and second light sources 200 and 300, z represents the position coordinates of the surface of the photographic medium 100, i=1, 2, . . . , N, and $a_1$, $a_2$ and $a_3$ respectively represent first, second and third unit exposure processes.

The standing wave represented by Equation 4 can be generated by splitting light emitted from a single light source into two and making the split lights interfere with each other. The final energy level distribution calculated by using Equation 3 is as follows.

$$\prod_{v=1}^{N}[(1-\cos(2k_0z+2\pi(v-1)/N))]/2 = \quad \text{[Equation 5]}$$

$$\frac{1}{2^N}\left(\frac{1-\cos(2Nk_0z)}{2}\right)$$

Equation 5 represents a pattern having a period corresponding to 1/N of the period of the original standing wave, and thus it can be known from Equation 5 that the resolution is improved N times.

The aforementioned method of exposing the standing wave multiple times can be used to form a two-dimensional pattern. For instance, the surface of the photographic medium 100 is considered as a two-dimensional xy plane and six unit exposure processes are performed at each of angles 0, $\pi/6$, $2\pi/6, \ldots, 5\pi/6$ to X-axis while rotating the wave vector of the standing wave to six directions respectively at the six angles. Here, a two-dimensional pattern can be formed by controlling the phase and intensity of the standing wave in each of the thirty-six unit exposure processes. Here, it is possible to make the intensities of two interfering lights different from each other when the standing wave is formed using the first light source 200 to achieve visibility having intensity distribution smaller than 1. A factor corresponding to each exposure process in Equation 3 is represented by Equation 6.

$$\frac{|S|^2}{(|S|^2+|R|^2)} = \frac{(1+r_1\cos(2\vec{k_0}\vec{r}+\Phi_i))}{1+r_i} \quad \text{[Equation 6]}$$

Here, $\vec{k_0}$ is a wave vector, $\vec{r}$ is a position vector, $r_i$ is a real number, and $\phi_i$ is an arbitrary real number.

Figure 5:
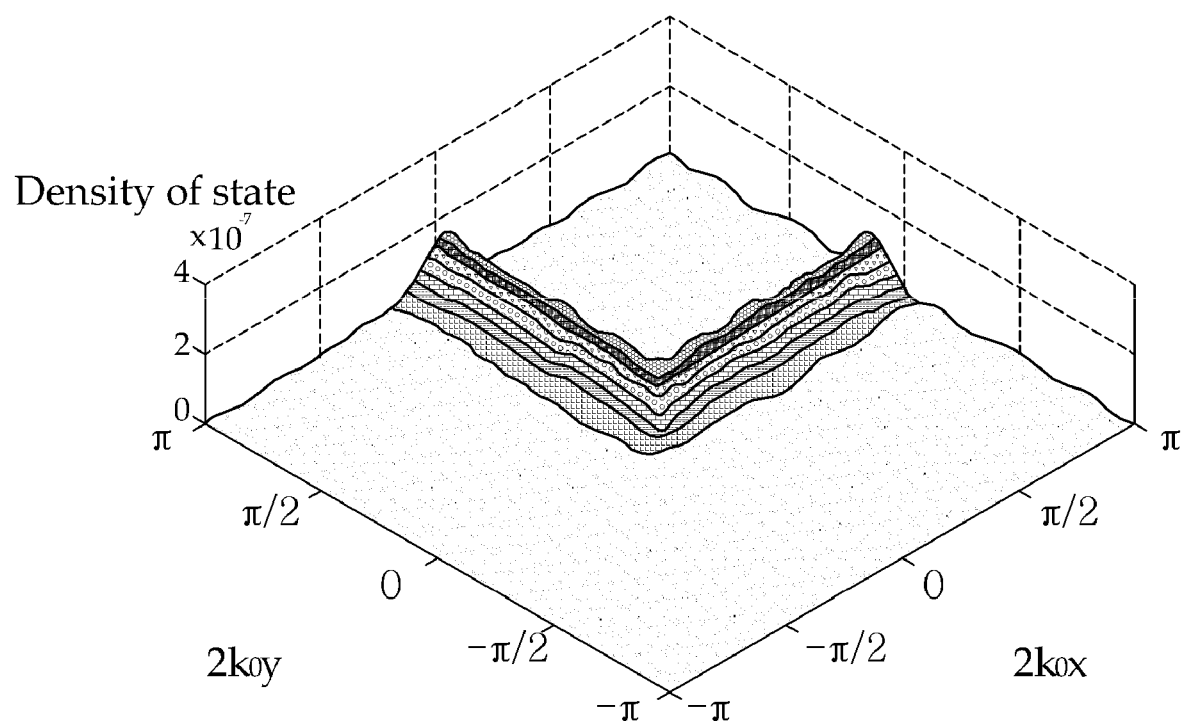
FIG. 5 illustrates an L-shaped super-resolution pattern generated through thirty-six unit exposure processes using a standing wave pattern by using a multiple light exposure method based super-high resolution lithography method according to a first embodiment of the present invention.

FIG. 5 illustrates an L-shape super-resolution pattern generated through thirty-six unit exposure processes using a standing wave pattern by using a multiple light exposure method based super-resolution lithography method according to a first embodiment of the present invention. Referring to FIG. 5, the L-shaped super-resolution pattern has a full width at half-maximum of about $0.16\pi$ and represents a resolution finer than the resolution limit due to diffraction by $\frac{1}{6}$. In FIG. 5, the vertical axis represents density of state and the bottom face represents position coordinates multiplied by wave numbers on X-axis and Y-axis.

(Second Embodiment)

A super-resolution lithography method based on a multiple light exposure method according to a second embodiment of the present invention has steps in the same order as those of the super-resolution lithography method based on the multiple light exposure method according to the first embodiment of the present invention. However, the super-resolution lithography method based on the multiple light exposure method according to the second embodiment of the present invention forms a two-dimensional pattern with improved resolution by using the first light source 200 having an arbitrary intensity distribution instead of the multiple standing wave patterns used in the first embodiment.

For instance, the first light source 200 is generated in such a manner that the first light source 200 has zero intensity at the center thereof by using destructive interference between a single condensed beam and a uniform beam. At this time, the second light source 300 used with the first light source 200 has an average intensity lower than 50% of the average intensity of the first light source 200. In this case, each factor in Equation 3 has a notch shape in which each factor is close to zero near the center of the first light source and close to 1 in most regions of the photographic medium 100. A full-width at half-maximum in a notch shape, generated in this case, is smaller than diffraction limit resolution of light. Accordingly, when the unit exposure process in this pattern is repeated while passing through the center of the notch shape, a micropattern can be formed.

Figure 6:
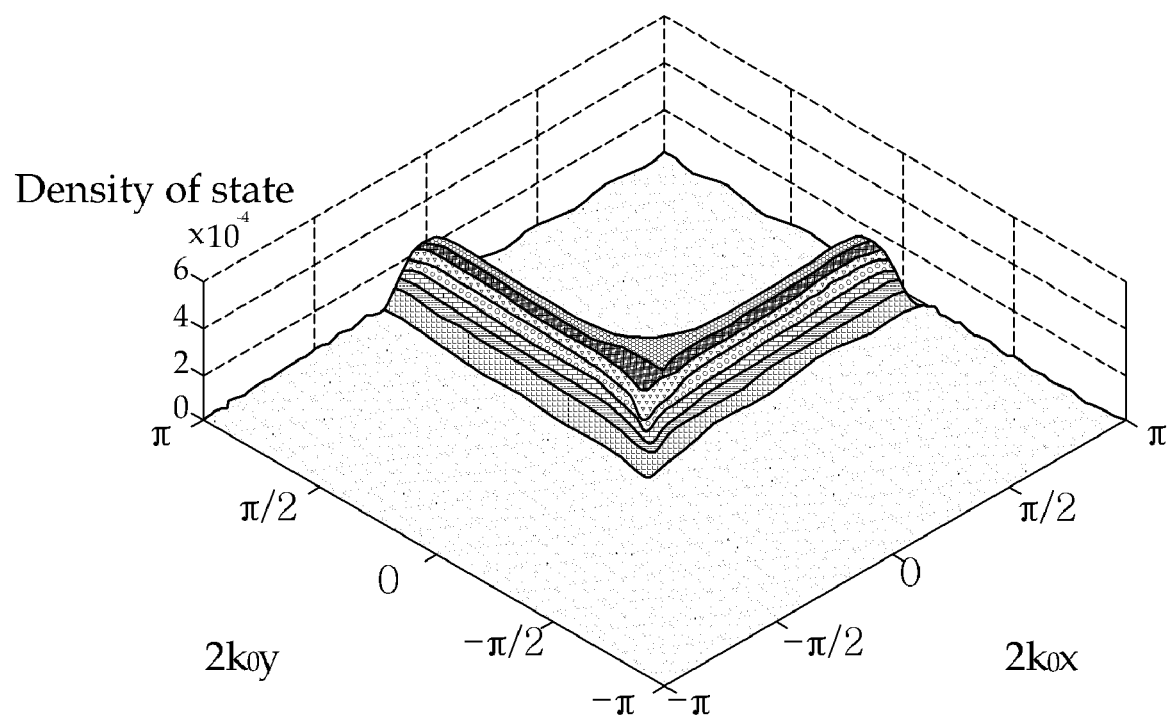
FIG. 6 illustrates an L-shaped super-resolution pattern generated through four-hundred-eighty-four unit exposure processes using a point-by-point pattern by using a multiple light exposure method based super-resolution lithography method according to a second embodiment of the present invention.

FIG. 6 illustrates an L-shaped super-resolution pattern generated through four-hundred-eighty-four unit exposure processes using a point-by-point pattern by using the super-resolution lithography method based on a multiple light exposure method according to the second embodiment of the present invention. Referring to FIG. 6, the first light source 200 has an intensity distribution having a full-width at half-maximum corresponding to $\pi$ at the center thereof and the second light source 300 has an intensity corresponding to $\frac{1}{100}$ of the average intensity of the first light 200 when a point-by-point method is used. In FIG. 6, the vertical axis represents density of state and the bottom face represents position coordinates multiplied by wave numbers on X-axis and Y-axis.

(Third Embodiment)

A super-resolution lithography method based on a multiple light exposure method according to a third embodiment of the present invention includes steps in the same order as those of the super-resolution lithography method based on the multiple light exposure method according to the first embodiment of the present invention. However, the super-resolution lithography method based on the multiple light exposure method according to the third embodiment of the present invention is distinguished from the super-resolution lithography method based on the multiple light exposure method according to the first embodiment of the present invention in that the first light 200 is projected through an appropriate mask. Here, the mask is an amplitude mask or a phase mask. The second light source 300 used in the third embodiment has an average intensity lower than 50% of the average intensity of the first light 200.

The probability that atoms exist in $|g_1\rangle$ state after a unit exposure process is zero at a node of an image projected through the mast, that is, a point at which light intensity is zero, and 1 in other regions of the image. When the unit exposure process is repeated multiple times, the final energy level distribution corresponds to the sum of all the nodes of mask images. Although the interval of nodes in the unit exposure process cannot exceed the resolution limit due to diffraction of light, the interval of regions at which the probability becomes zero in finally summed probability distribution can exceed the resolution limit due to diffraction of light because the width of a region at which the probability is zero is smaller than the resolution limit due to diffraction of light.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A super-resolution lithography method based on a multiple light exposure method, comprising:
   a first step of exposing a photographic medium having a plurality of energy levels of a first ground state, a second ground state, a first excited state, a second excited state and a quenching state to a first light source with a first spatial intensity distribution and a second light source with a second spatial intensity distribution, wherein the first light source induces energy level transition between the first ground state and the first excited state of the photographic medium, the second light source induces energy level transition between the second ground state and the first excited state of the photographic medium and the first excited state spontaneously decays to the first ground state and the second ground state;

a second step of exposing the photographic medium having the plurality of energy levels to a third light source spatially uniform, wherein the third light source induces energy level transition between the second ground state and the second excited state of the photographic medium and the second excited state spontaneously decays to the second ground state and the quenching state; and wherein the first step and sequentially the second step are repeatedly performed until a desired lithography resolution is obtained.

2. The super-resolution lithography method of claim 1, further comprising a third step of confirming whether a desired energy level distribution is obtained through the first and second steps.

3. The super-resolution lithography method of claim 2, wherein the first and second steps are continuously repeated more than twice until the desired energy level distribution is obtained in the third step.

4. The super-resolution lithography method of claim 1, wherein the first light source forms a standing wave according to interference of light in the photographic medium.

5. The super-resolution lithography method of claim 4, wherein the second light source forms a standing wave having a phase difference in the range of $0.4\pi$ to $0.6\pi$ with the phase of the standing wave formed according to the first light source in the photographic medium.

6. The super-resolution lithography method of claim 1, wherein the first light source forms an amplitude mask image in the photographic medium.

7. The super-resolution lithography method of claim 1, wherein the first light source forms a phase mask image in the photographic medium.

8. The super-resolution lithography method of claim 1, wherein the maximum intensity of the second light source in the photographic medium is lower than 50% of the average intensity of the first light source.

9. The super-resolution lithography method of claim 1, wherein the photographic medium is Rb.

10. The super-resolution lithography method of claim 1, wherein the photographic medium is Ar.

11. The super-resolution lithography method of claim 1, wherein the photographic medium is n-type GaAs.

12. The super-resolution lithography method of claim 1, wherein the photographic medium is Pr-doped SiO.

13. The super-resolution lithography method of claim 1, wherein the first, second, and third light sources are laser beams having different wavelengths.

* * * * *